United States Patent [19]

Bose

[11] Patent Number: 4,549,631

[45] Date of Patent: Oct. 29, 1985

[54] MULTIPLE PORTING LOUDSPEAKER SYSTEMS

[75] Inventor: Amar G. Bose, Wayland, Mass.

[73] Assignee: Bose Corporation, Framingham, Mass.

[21] Appl. No.: 544,466

[22] Filed: Oct. 24, 1983

[51] Int. Cl.[4] .................................... H05K 5/00

[52] U.S. Cl. .................................... 181/155; 181/156; 181/160; 181/199

[58] Field of Search ............... 181/145, 156, 155, 163, 181/160, 144, 150, 199

[56] References Cited

U.S. PATENT DOCUMENTS 1,969,704 8/1934 d'Alton .............................. 181/160

3,688,864 9/1972 Guss ............................... 181/145 X

OTHER PUBLICATIONS

Audio Cyclopedia, pp. 1102–1104.

*Primary Examiner*—L. T. Hix

*Assistant Examiner*—Brian W. Brown

*Attorney, Agent, or Firm*—Charles Hieken

[57] ABSTRACT

A loudspeaker system has an enclosure of rectangular cross section with a baffle dividing the interior into first and second subchambers. Each subchamber has a port tube coupling the subchamber to the region outside the enclosure. The dividing baffle carries a woofer.

7 Claims, 7 Drawing Figures

MULTIPLE PORTING LOUDSPEAKER SYSTEMS

The present invention relates in general to improving the performance of a loudspeaker system at lower frequencies, and more particularly concerns an improved loudspeaker system characterized by improved performance at the low range of frequencies with structure that is relatively easy and inexpensive to fabricate.

A major problem in making a loudspeaker system for low frequency reproduction is to obtain a high output at the low frequencies while limiting loudspeaker cone excursion to reasonable limits within a displacement region relatively free from audible distortion sufficiently limited so that the cost of making this region is not excessive.

Many prior art low frequency speaker systems comprise a simple woofer with no enclosure, as in television and radio sets and some public address systems. A difficulty with these systems is that there is no means for preventing the radiation from the back of the speaker from canceling the radiation from the front. Such a system has very large cone excursions at low frequencies.

One prior art approach for reducing back radiation is to place the loudspeaker driver in a closed box to form what is often called an acoustic suspension system. An acoustic suspension system provides a reactance against which the loudspeaker driver works, limiting the excursion and also preventing the radiation from the back of the loudspeaker from canceling that from the front.

A ported system is one prior art approach to improving upon the acoustic suspension system. A ported system typically includes a woofer in the enclosure and a port tube serving as a passive radiating means. The air in the port tube provides an acoustic mass that allows system design with an extra reactance which can be used to tailor the frequency response at the low end. A ported system is characterized by a resonance (port resonance) at which the mass of air in the port reacts with the volume of air in the cabinet to create a resonance at which the cone excursion of the loudspeaker is minimized. A ported system exhibits improved sensitivity at port resonance and decreased cone excursion, thereby minimizing distortion. The result of the improved sensitivity at port resonance is frequently an extension of the lower cutoff frequency of the loudspeaker to a lower value.

It is an important object of this invention to provide an improved ported loudspeaker.

According to the invention, there is enclosure means for supporting at least one loudspeaker driver means for converting electrical energy into acoustical energy. There is dividing means for dividing the enclosure means into at least first and second subchambers. There are at least first and second port means in said first and second subchambers respectively for providing first and second acoustical masses respectively. The dividing means preferably comprises means for supporting the loudspeaker driving means and coacting therewith to separate the first and second subchambers.

Numerous other features, objects and advantages of the invention will become apparent from the following specification when read in connection with the accompanying drawing in which.

Figure 1:
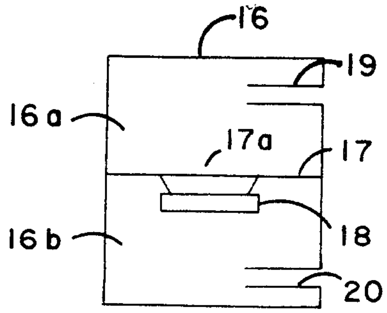
FIG. 1 is a diagrammatic representation of an embodiment of the invention.

With reference now to the drawing and more particularly FIG. 1 thereof, there is shown a diagrammatic representation of an embodiment of the invention comprising an enclosure 16 of conventional rectangular cross section divided into two subchambers **16*a* and 16*b* by a dividing member 17 formed with an opening 17*a* to expose chamber 16*a* to the top surface of the cone of loudspeaker driver 18. The bottom surface of driver 18 is exposed to lower subchamber 16*b*. Port tubes 19 and 20 couple the interiors of enclosures 16*a* and 16*b***, respectively, to the outside. The result of this arrangement having two subchambers and two port tubes is to lower the cone excursion in the low frequency region from that which could be obtained with a standard ported system and also to provide an additional parameter value that may be adjusted for maximizing response in the low frequency region.

Figure 2:
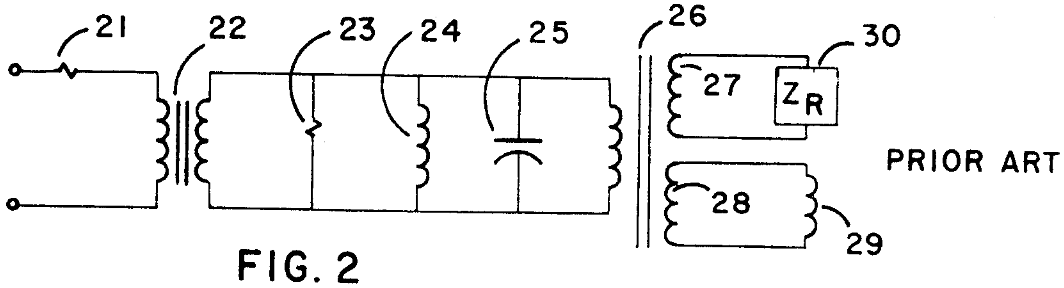
FIGS. 2, 3 and 4 are equivalent electronic circuit models of loudspeaker systems corresponding to a prior art acoustic suspension system, a prior art ported system and a system according to the invention, respectively.

The principles and advantages of the invention can better be appreciated by reviewing equivalent electronic circuit models of the prior art loudspeaker systems in comparison with that of a loudspeaker system according to the invention. Where appropriate the same reference symbols identify corresponding elements throughout the drawing. Referring to FIG. 2, there is shown the equivalent electronic circuit model of an acoustic suspension loudspeaker system. This schematic includes a resistor 21 representing the resistance of the voice coil. A transformer 22 represents the transformation between voice coil current and force on the moving parts of the loudspeaker system. Thus, the variable across the secondary of transformer 22 represents cone velocity and the variable through it represents force. Shunt resistor 23 represents the losses in the speaker suspension. The compliance of the suspension is represented by inductor 24. The mass of the speaker cone is represented as capacitor 25. The motion of the cone excites the air through its cone area modeled as transformer 26. Since the loudspeaker has front and rear surfaces, the air volume velocity moved by each is represented by two separate secondary windings 27 and 28, respectively. The front surface of the cone represented by secondary 27 excites the air and produces acoustic power represented as dissipated in radiation impedance 30. Meanwhile, the back surface of the cone simply excites the air inside the enclosure represented as compliance 29.

Figure 3:
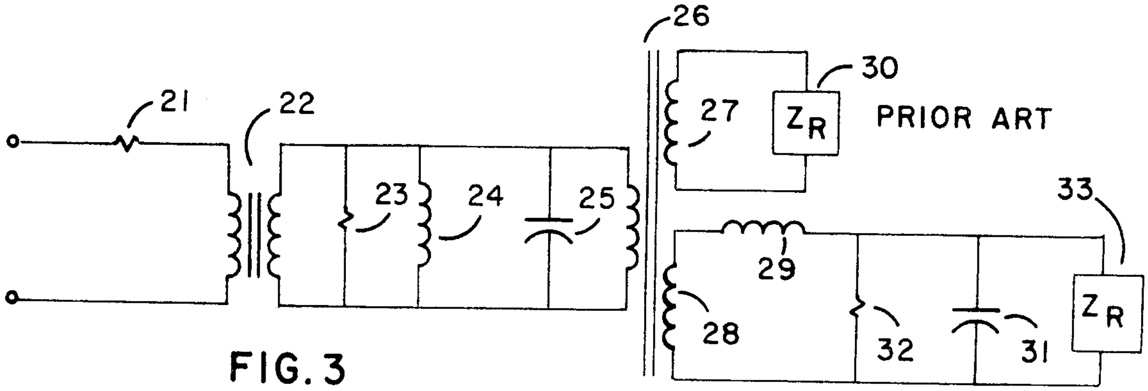

Referring to FIG. 3, there is shown the equivalent electronic circuit model of a ported prior art loudspeaker. The air enclosed in the box is represented as inductor 29 in series with the parallel combination of the mass of the air in the port tube represented as capacitor 31, the lossiness of the port tube caused by air friction of air motion in the port tube represented as resistor 32, and the radiation impedance seen at the output of the port tube represented by radiation impedance 33.

Figure 4:
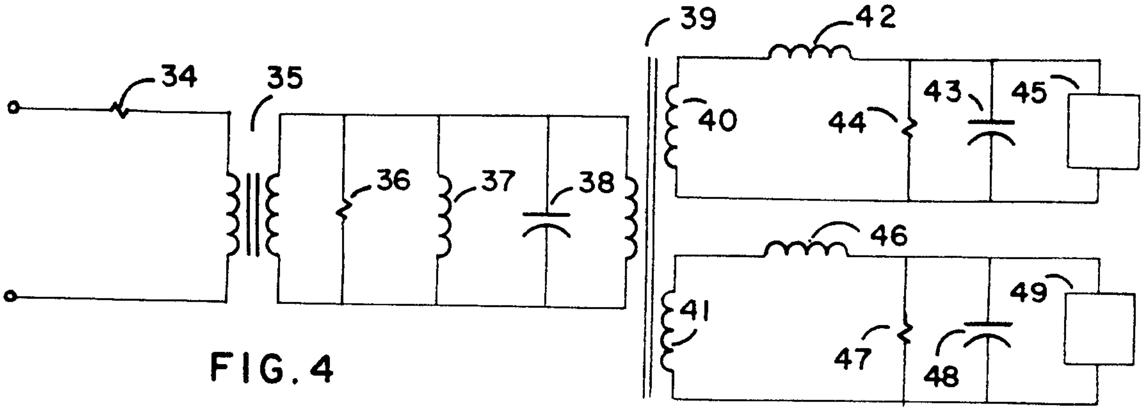

Referring to FIG. 4, there is shown an equivalent electronic circuit model of a loudspeaker system according to the invention. In this case the front or top surface of the cone no longer drives a radiation impedance directly, but is now coupled to an air volume in upper chamber 16*a* represented by inductor 42. The mass of air in port tube 19 is represented by capacitor 43 with the lossiness therein represented by resistor 44. The radiation impedance presented at the exposed end of port tube 19 is represented as radiation impedance 45.

The back or bottom side coupling is represented by secondary winding 41 driving inductor 46 representing the air volume in lower chamber 16*b*. The acoustic mass of port tube 20 is represented by capacitor 48 and the lossiness therein caused by air motion represented by resistor 47. Finally impedance 49 represents the acoustic impedance at the exposed opening of port tube 20. Elements 34–39 in FIG. 4 correspond to elements 21–26, respectively, in FIGS. 2 and 3.

A preferred embodiment of the invention employs the parameter values listed below for the different elements:

34 = 3.2 ohms
35 = 20 N/A
36 = 0.4 m/N-sec
37 = $3\times10^{-3}$ m/N
38 = 0.087 kg
39 = 0.1 $m^3$-sec/m-sec
42 = $6.14\times10^{-7}$ $m^5$/N
43 = 13.1 Kg/$M^4$
44 = $3.92\times10^{-3}$ $m^5$/N-sec
45 = $3.27\times10^{-5}$ −j 1/W·2.89
46 = $2.05\times10^{-7}$ $m^5$/N
48 = 7.1 Kg/$M^4$
47 = $2.83\times10^{-3}$ $m^5$/N-sec
49 = $3.27\times10^{-5}$ −j 1/W·2.89

It has been discovered that best results are obtained when the ratio of volumes of the two subchambers 16*a* and 16*b* is within the range 2:1 and 4:1, with the ratio of the corresponding port resonances in a ratio within the range between 1.5:1 and 3.0:1.

Figure 5:
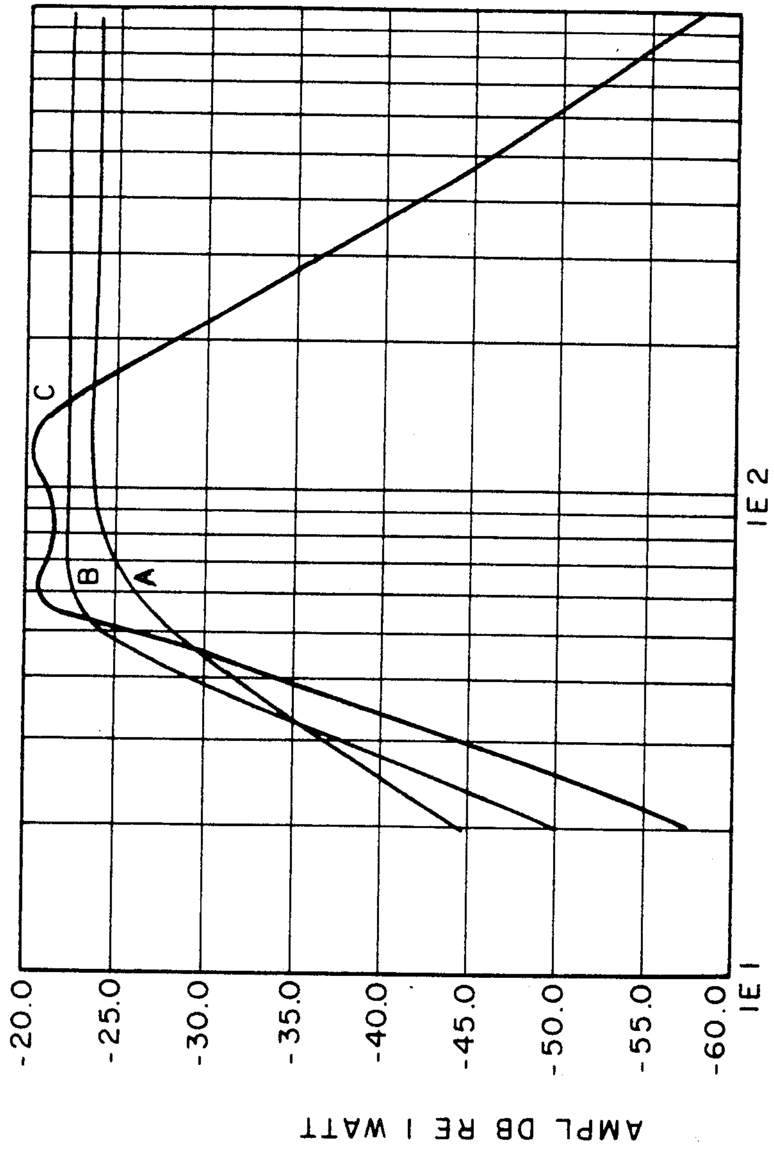
FIGS. 5 and 6 are graphical representations of power output and cone deflection, respectively, of the systems of FIGS. 2–4.

Referring to FIG. 5, there is shown the acoustic power radiated by an acoustic suspension system as a function of frequency by curve A; a prior art ported system, by curve B; and the invention, by curve C with each system having the same total enclosure volume and minimum realizable moving mass with the loudspeaker and port parameters having been appropriately optimized for each system by adjusting elements 35, 37, 39, 42, 43, 46 and 48 for maximum output above cutoff, typically 60 Hz. The invention provides improved output in the bass region, and a sharper cutoff at higher frequencies.

Figure 6:
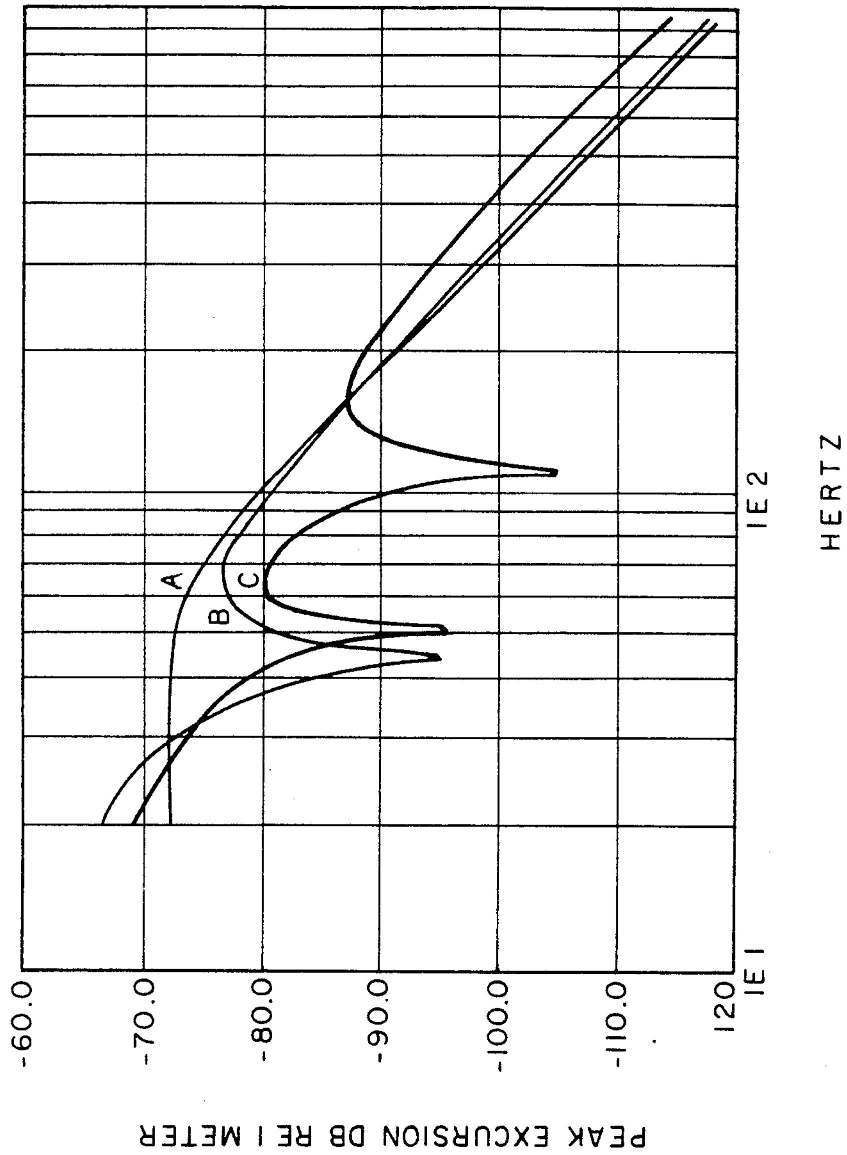

Referring to FIG. 6, there is shown a graphical representation of cone deflection as a function of frequency for a prior art acoustic suspension system, in curve A; a prior art ported system, in curve B; and according to the invention, in curve C. Curve A shows that the cone excursion of the acoustic suspension speaker rises with decreasing frequency. Curve B shows that the prior art ported system has a port resonance where the cone excursion is minimized. Curve C shows that the two-port system according to the invention has two such resonances where the cone excursion can be minimized. Thus the overall cone excursion on complex signals is lower than with comparable prior art systems. An actual working model of the invention with the parameters set forth above has been built and tested and found to provide the improved performance described above.

Figure 7:
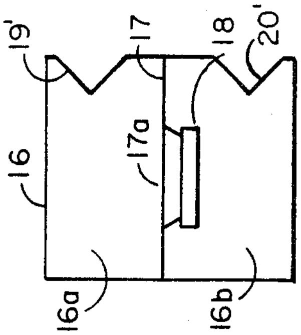
FIG. 7 is a diagrammatic representation of an alternate embodiment of the invention with drone cones.

A number of variations may be practiced within the principles of the invention. For example, the driver could be coupled to more than one port tube on each side through additional subchambers. The passive radiators may be embodied by port tubes as shown, by "drone cones" 19', 20' as shown in FIG. 7, or other passive radiating means. The single woofer may be replaced by multiple transducers to achieve the desired total area, motor force and power handling capability.

There has been described apparatus and techniques for providing increased sensitivity in the bass region, and/or a lower cutoff frequency and/or an acoustic high frequency cutoff which will limit the response of the speaker at the high end. This acoustic high frequency cutoff is advantageous in employing a woofer in combination with a midfrequency or high frequency driver to function as an acoustic part of the crossover network employed to couple the low frequency system to the remainder of a broadband speaker system.

It is evident that those skilled in the art may now make numerous other modifications of and departures from the specific apparatus and techniques herein disclosed without departing from the inventive concepts. Consequently, the invention is to be construed as embracing each and every novel feature and novel combination of features present in or possessed by the apparatus and techniques herein disclosed and limited soley by the spirit and scope of the appended claims.

What is claimed is:

1. An improved ported loudspeaker system comprising, electroacoustical transducing means having a vibratible cone, enclosure means for supporting said electroacoustical transducing means for converting an input electrical signal into a corresponding acoustic output signal, dividing means coacting with said electroacoustical transducing means for dividing the interior of said enclosure means into first and second subchambers with a first surface of said electroacoustical transducing means contacting said first subchamber and a second surface of said electroacoustical transducing means contacting said second subchamber, first and second passive radiating means each characterized by acoustic mass for coupling said first and second subchambers respectively to the region outside said enclosure means, said first subchamber and said first passive radiating means configured for establishing a first resonance at a first bass frequency for minimizing excursion of said cone at said first bass frequency, and said second subchamber and said second passive radiating means configured for establishing a second resonance at a second bass frequency for minimizing excursion of said cone at said second bass frequency.

2. A loudspeaker system in accordance with claim 1 wherein the ratio of said subchamber resonant frequencies is within the range of 1.5:1 to 3:1.

3. A loudspeaker system in accordance with claim 1 wherein the ratio of the volume of said first subchamber to that of said second subchamber is within the range of 2:1 to 4:1.

4. A loudspeaker system in accordance with claim 1 wherein at least one of said passive radiating means comprises a port tube.

5. A loudspeaker system in accordance with claim 1 wherein at least one of said passive radiating means comprises a drone cone.

6. A loudspeaker system in accordance with claim 2 wherein said ratio is of the order of 2:1.

7. A loudspeaker system in accordance with claim 3 wherein said ratio is of the order of 3:1.

* * * * *